United States Patent
Nagai et al.

(10) Patent No.: US 8,274,127 B2
(45) Date of Patent: Sep. 25, 2012

(54) PHOTODIODE ARRAY FOR IMAGE PICKUP DEVICE

(75) Inventors: Youichi Nagai, Osaka (JP); Yasuhiro Iguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 511 days.

(21) Appl. No.: 12/494,393

(22) Filed: Jun. 30, 2009

(65) Prior Publication Data

US 2010/0327386 A1 Dec. 30, 2010

(51) Int. Cl.
*H01L 27/146* (2006.01)

(52) U.S. Cl. ........ 257/444; 257/446; 257/459; 257/466; 257/E31.032; 257/E31.057

(58) Field of Classification Search ................ 257/431, 257/435, 436, 437, 444, 446, 457, 459, 466, 257/E31.032, E31.057
See application file for complete search history.

(56) References Cited

U.S. PATENT DOCUMENTS

| | | | |
|---|---|---|---|
| 5,594,237 A * | 1/1997 | Kulick et al. | 250/214.1 |
| 6,975,035 B2 * | 12/2005 | Lee | 257/778 |
| 7,375,340 B2 * | 5/2008 | Hietanen et al. | 250/370.09 |

FOREIGN PATENT DOCUMENTS

| | | |
|---|---|---|
| JP | 2001-144278 | 5/2001 |
| JP | 2005-123217 | 5/2005 |

OTHER PUBLICATIONS

Ishihara et al., (2000) "InGaAs Linear Image Sensor for Near-Infrared range and their applications", Technical Report of the Inst. Of Elect. Eng. Of Japan, Tech. Com. On Light Application and Visual Science, JN Z0953A vol. LAV-00 Nos. 7-13:31-36 (with partial English translation).

* cited by examiner

*Primary Examiner* — Evan Pert
(74) *Attorney, Agent, or Firm* — Fish & Richardson P.C.

(57) ABSTRACT

A photodiode array includes a substrate of a common read-out control circuit; and a plurality of photodiodes arrayed on the substrate and each including an absorption layer, and a pair of a first conductive-side electrode and a second conductive-side electrode. In this photodiode array, each of the photodiodes is isolated from adjacent photodiodes, the first conductive-side electrodes are provided on first conductivity-type regions and electrically connected in common across all the photodiodes, and the second conductive-side electrodes are provided on second conductivity-type regions and individually electrically connected to read-out electrodes of the read-out control circuit.

1 Claim, 6 Drawing Sheets

PHOTODIODE ARRAY FOR IMAGE PICKUP DEVICE

BACKGROUND OF THE INVENTION

1. Field of the Invention

The present invention relates to a photodiode array and image pickup device in which a high-resolution image can be obtained, and a manufacturing method for the same.

2. Description of the Related Art

With the increasing interest in image sensors (image pickup devices) for near-infrared light, a problem of image irregularities caused by cross-talk of light between photodiodes constituting pixels of the image sensors has been a matter of concern (Masatoshi Ishihara, et al., "InGaAs Linear Image Sensor for Near-Infrared Range and their applications", Technical report of The Institute of Electrical Engineers of Japan, Technical Committee on Light Application and Visual Science, JN: Z0953A Vol. LAV-00 Nos. 7-13; pp. 31-36; (Oct. 26, 2000)). Cross-talk is a phenomenon of degradation of resolution caused by light absorption in adjacent photodiodes, thereby generating a signal current in the adjacent photodiodes (pixels), and a solution to this problem has been desired.

In addition, incident light includes not only near-infrared light but also light of a shorter wavelength range (at the visible light side) in most cases. Accordingly, as shown in FIG. 12, in an image sensor having an epi-side-down mounting structure (substrate-illuminated structure) in which an InP substrate 101 is disposed on the light-incident side, light is absorbed in the InP substrate 101. In this case, a photocurrent diffuses in the InP substrate 101 and, the photocurrent is provided to two or more photodiodes 110. Consequently, an image is blurred, resulting in a problem of degradation of the image quality.

In FIG. 12, a semiconductor multilayer structure includes the InP substrate 101, an InGaAs absorption layer 103, and an InP window layer 104. A p-type region 106 reaching the absorption layer 103 is formed through the InP window layer 104, and a p-n junction 115 is formed in the absorption layer 103. The p-type region 106 is formed by selectively diffusing zinc (Zn) through an opening of a selective diffusion mask pattern 105, and the selective diffusion mask pattern 105 is left as is. The selective diffusion mask pattern 105 is further covered with an anti-reflection (AR) film 109. A p-side electrode 111 is provided so as to form ohmic contact with the corresponding p-type region 106. An n-side electrode 112 that forms a pair with the p-side electrode 111 is also provided. The n-side electrode 112 is electrically connected to a ground potential common to the photodiodes 110. The p-side electrodes 111 function as pixel electrodes and are individually connected to electrode pads 131 of a complementary metal-oxide semiconductor (CMOS) 130. The n-side electrode 112 is connected to a ground electrode pad 132 of the CMOS 130.

In the above image sensor, as the interval between the arrayed photodiodes decreases, degradation of the resolution becomes increasingly significant. Therefore, it is impossible to increase the number of pixels in a sensor portion having certain dimensions. Accordingly, an increase in the chip size required for increasing the number of pixels results in an increase in the cost, and such an increase in the chip size is counter to a reduction in size. To overcome this problem, Japanese Unexamined Patent Application Publication No. 2001-144278 has proposed a photodiode array which has a mesa structure and in which isolation trenches are formed between photodiodes by etching. In addition, Japanese Unexamined Patent Application Publication No. 2005-123217 has proposed a structure in which isolation trenches are provided between photodiodes and a metal film is provided in the isolation trenches, thus isolating the photodiodes with the metal film.

A certain advantage is achieved by the above-described structures in which only isolation trenches or isolation trenches and a metal film are provided between photodiodes. However, light can freely propagate through a semiconductor substrate, and thus light that undergoes multiple reflections through the semiconductor substrate enters adjacent photodiodes. Accordingly, a decrease in the resolution due to cross-talk or the like cannot be sufficiently suppressed.

SUMMARY OF THE INVENTION

It is an object of the present invention to provide a photodiode array and image pickup device that include a mechanism with which a high resolution can be obtained, and a manufacturing method for the same.

A photodiode array of the present invention includes a substrate of a common read-out control circuit; and a plurality of photodiodes arrayed on the substrate and each including an absorption layer, and a pair of a first conductive-side electrode and a second conductive-side electrode. In this photodiode array, each of the photodiodes is isolated from adjacent photodiodes. The first conductive-side electrodes are provided on first conductivity-type regions and electrically connected in common across all the photodiodes, and the second conductive-side electrodes are provided on second conductivity-type regions and individually electrically connected to read-out parts of the read-out control circuit.

According to the above structure, the photodiodes are isolated from each other, that is, the photodiodes are separated from each other over the entire thickness of the semiconductor multilayer structure. This structure can significantly decrease the probability that incident light is absorbed by adjacent two photodiodes. Furthermore, a photocurrent or the like generated in a part of a layer at the light-incident surface side cannot flow to an adjacent photodiode. Therefore, an image having a high resolution without cross-talk or blurring can be obtained. A semiconductor substrate such as a silicon substrate is used as the substrate of the read-out control circuit, and the read-out control circuit is provided on the silicon substrate.

The photodiodes may be semiconductor multilayer structures formed on a semiconductor substrate, and the semiconductor substrate may have been removed or the semiconductor substrate may be included in the semiconductor multilayer structure. Accordingly, in the former case, the effect of light absorption by the semiconductor substrate can be eliminated, thus obtaining a photodiode array that can be suitably used in an image pickup device or the like for, for example, visible light and near-infrared light. In the latter case, the photodiode may include an absorption layer having responsivity in, for example, the near-infrared range, and the semiconductor substrate may be used as an absorption plate (filter) of a wavelength range shorter than the near-infrared range. In this case, a near-infrared dedicated image pickup device can be obtained.

The photodiode array may further include a continuous insulating protective member, and the photodiode array may be fixed to the substrate of the read-out control circuit with the protective member therebetween on the side at which the photodiode array is connected to the substrate. According to this structure, when the photodiodes are completely separated from each other, they are not divided into pieces, and thus the accuracy of an arrangement of a one-dimensional array or a two-dimensional array can be increased. In addition, according to this structure, when slits are formed by a mechanical method or a chemical method, the protective member can prevent the read-out control circuit side from being damaged. The protective member is preferably used together with an electrode arrangement disposed on the read-out control circuit side, the electrode arrangement having, in addition to the main function, a function of fixing an arrangement similar to the function of the protective member.

The photodiode array may further include a connecting member that electrically connects the first conductive-side electrodes of the photodiodes in common and that is disposed on the light-incident side of the photodiode array. The connecting member may be a sheet-like member having openings at positions corresponding to light-incident portions of the photodiodes or a light-transmissive electrically conductive sheet that transmits target light to be absorbed by the absorption layer. In this case, in each photodiode, a common potential (ground potential) can be applied to the first conductive-side electrodes without affecting at least the responsivity of target light.

In the photodiodes, each of the second conductivity-type regions may be formed by selective diffusion for corresponding photodiode so as to face the absorption layer, and the second conductive-side electrodes may be provided on the corresponding second conductivity-type regions. The second conductive-side electrodes may be connected to the corresponding read-out electrodes on the substrate of the read-out control circuit. Accordingly, a surface of the semiconductor multilayer structures opposite a surface on which the second conductive-side electrodes are disposed may function as a light-incident surface. In this structure, each of the second conductivity-type regions formed by the selective diffusion is formed inside the periphery of each photodiode. Accordingly, the p-n-junction is not exposed to a slit surface, and thus leakage current can be prevented in each photodiode. As a result, a photodiode array having a satisfactory responsivity and good image quality can be obtained.

A p-n junction may be formed by a first conductivity-type epitaxial layer and second conductivity-type epitaxial layer in the absorption layer. The second conductive-side electrodes may be disposed on the corresponding photodiodes, the second conductive-side electrodes may be connected to the corresponding read-out electrodes on the substrate of the read-out control circuit, and a surface of the semiconductor multilayer structures opposite a surface on which the second conductive-side electrodes are disposed may function as a light-incident surface. In this case, the photodiode array can be manufactured by a simple process that does not require a step of forming a mask pattern for selective diffusion of an impurity or steps related thereto. Note that the term "p-n junction" used herein should be broadly interpreted as follows: In the absorption layer, when a region on a surface opposite a surface from which an impurity element is introduced by selective diffusion is an impurity region (also referred to as "i region") in which the impurity concentration is low enough for the impurity region to be considered an intrinsic semiconductor, a junction formed between the impurity region formed by the selective diffusion and the i-region is also included in the p-n junction. That is, the above p-n junction may be a p-i junction, an n-i junction, or the like. The above interpretation of the term "p-n junction" applies to all positions.

In addition, when an impurity element is selectively diffused, only limited elements suitable for selective diffusion can be used. At present, zinc (Zn), which is a p-type impurity, has been exclusively used. Accordingly, pixel electrodes are p-side electrodes, and it is necessary that a CMOS have a circuit configuration having a special specification for a p-type carrier input. In contrast, the above restriction can be eliminated in the case of epitaxially grown films, and thus n-side electrodes can be used as the pixel electrodes by using an n-type impurity as the second conductivity-type impurity. As a result, an image pickup device can be constituted by using a general-purpose CMOS for an n-type carrier input, thus obtaining an image pickup device having high economical efficiency.

The absorption layer may be composed of a semiconductor having a band-gap energy corresponding to the near-infrared range. In this case, a photodiode array can be obtained in which cross-talk can be significantly suppressed and a high-image quality without blurring or the like can be realized.

The absorption layer may be composed of InGaAs or InGaAs containing at least one of N, P, and Sb. By incorporating N, a photodiode array having responsivity at the long-wavelength side of the near-infrared range can be obtained. By incorporating P or Sb, crystals with good quality in which the generation of dark current is suppressed can be obtained.

An image pickup device of the present invention includes any of the photodiode arrays described above, wherein light is taken from a light-incident surface of the photodiode array, and a light-receiving signal is sequentially read out from the second conductive-side electrodes of the photodiodes to the corresponding read-out electrodes of the read-out control circuit to form an image.

According to this structure, an image pickup device in which a high-image quality can be achieved with a high-speed read out can be obtained by using the photodiode array with a high array density and a CMOS or the like as the read-out control circuit. Note that, specifically, either a p-side electrode or an n-side electrode may be used as the second conductive-side electrode as long as the electrode is individually provided for each photodiode.

A manufacturing method for a photodiode array of the present invention includes the steps of forming a semiconductor multilayer structure including an absorption layer having a p-n junction; forming arrayed second conductive-side electrodes on a surface of the semiconductor multilayer structure so as to correspond to second-conductivity type regions of photodiodes; forming first conductive-side electrodes on first conductivity-type regions each of which forms a pair with the corresponding second-conductivity type region; and connecting the second conductive-side electrodes to corresponding read-out electrodes on a substrate of a read-out control circuit. The manufacturing method for a photodiode array of the present invention further includes the steps of forming slits extending over the entire thickness of the semiconductor multilayer structure lengthwise and crosswise so as to divide the semiconductor multilayer structure into each of the photodiodes; and connecting the first conductive-side electrodes of the photodiodes divided by the slits to each other with an electrical connection member.

According to the above method, a photodiode array in which photodiodes are completely separated from each other can be obtained, and a photodiode array in which cross-talk is suppressed and which can provide a high-quality image without blurring or the like can be obtained by a relatively simple method.

In the step of forming a semiconductor multilayer structure, a second conductivity-type impurity may be introduced from the surface of the semiconductor multilayer structure for each of the photodiodes by selective diffusion to form second conductivity-type regions. Thus, the p-n junction may be formed in the absorption layer so that each of the second conductivity-type regions is disposed inside the periphery of the corresponding photodiode. In the step of forming slits, the slits can be formed so that each of the second conductivity-type regions is disposed inside the periphery. According to this method, the p-n-junction formed in the absorption layer is not exposed to a slit surface, which divides the photodiodes to each other. Consequently, leakage in the photodiodes can be prevented.

In the manufacturing method for a photodiode array of the present invention, the semiconductor multilayer structure may be formed on a semiconductor substrate, and the method may further include a step of removing the semiconductor substrate from the semiconductor multilayer structure. According to this method, when, for example, the reverse face of the semiconductor substrate functions as a light-incident surface, absorption by the semiconductor substrate can be eliminated. Consequently, a decrease in the responsivity in the absorption layer can be prevented in a wavelength range of the absorption.

According to a manufacturing method for an image pickup device of the present invention, in any of the manufacturing methods for a photodiode array described above, the second conductive-side electrodes in the photodiode array are connected to the corresponding read-out electrodes on the substrate of the read-out control circuit. Thus, the photodiode array is fixed, and the slits are then formed so as to extend over the entire thickness of the semiconductor multilayer structure lengthwise and crosswise so as to separate the photodiodes from each other.

According to this method, an image pickup device in which cross-talk and blurring are suppressed and which has a high-resolution image quality can be obtained.

DESCRIPTION OF THE PREFERRED EMBODIMENTS

First Embodiment

Figure 1:
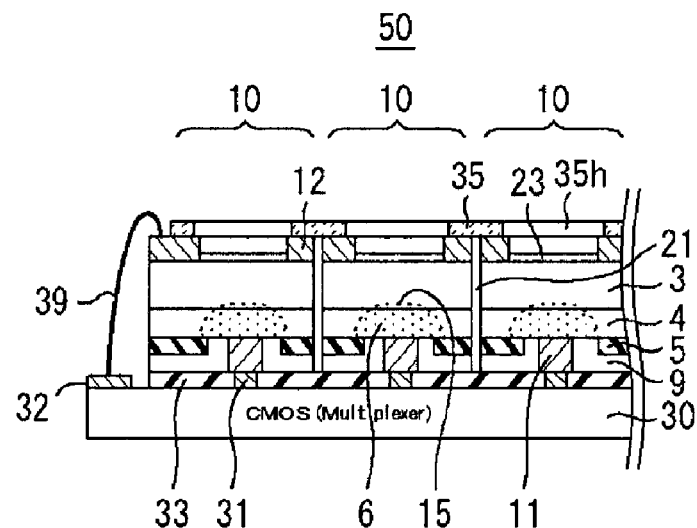
FIG. 1 is a view showing an image pickup device according to a first embodiment of the present invention.

FIG. 1 is a cross-sectional view showing an image pickup device 50 according to a first embodiment of the present invention. A semiconductor multilayer structure includes an InGaAs absorption layer 3 that may contain at least one of N, Sb, and P and an InP window layer 4. A p-type region 6 is formed so as to penetrate through the InP window layer 4 and reach the absorption layer 3, thus forming a p-n junction 15 at an end of the p-type region 6. The InGaAs constituting the absorption layer 3 may or may not contain at least one of N, P, and Sb. The p-type region 6 is formed by selectively diffusing Zn, which is a p-type impurity, through an opening of a selective diffusion mask pattern 5. The selective diffusion mask pattern 5 is left as is, and further covered with an anti-reflection (AR) film 9.

In each photodiode 10, a p-side electrode 11 is connected to a portion of the p-type region 6 of the InP window layer 4 to constitute a pixel electrode. On the light-incident surface side of the absorption layer 3, an anti-reflection (AR) film 23 is provided in a central area of the light incidence. An n-side electrode 12 is provided around the AR film 23 and is connected to the absorption layer 3. In addition to the AR film 9, an insulating protective member 33 is provided on the p-side electrode 11 side. The protective member 33 functions as a protective material in forming slits described below. The p-side electrode 11 and the n-side electrode 12 form a pair in each photodiode 10. The n-side electrode 12 is connected to a ground potential in common using an electrically conductive connecting member 35 having openings 35h.

In a photodiode array including the photodiodes 10, the p-side electrode 11 of each photodiode 10 is connected to an electrode pad 31 of a CMOS 30 to input an pixel current to the CMOS 30. The AR film 9 of the photodiode array is fixed to the insulating protective member 33, which has a function of protecting each element during the formation of slits. The connecting member 35 connecting the n-side electrodes 12 to each other is connected to a ground potential pad 32 of the CMOS 30 using a bonding wire 39. Features of the present embodiment Features of the image pickup device or the photodiode array of this embodiment are as follows.

(1) A photodiode 10 is separated from adjacent photodiodes with slits 21 extending over the entire thickness of the semiconductor multilayer structure. That is, the photodiode 10 is surrounded by slits extending over the entire thickness of the semiconductor multilayer structure.

(2) In the above-described photodiode array, a semiconductor substrate is eliminated. The absorption layer 3 constitutes a light-incident surface, and directly absorbs light without light absorption by the semiconductor substrate. In the case of an image pickup device for the near-infrared range, the absorption layer 3 is formed of a material with which responsivity can be extended to the long-wavelength side of the near-infrared range. On the other hand, as the semiconductor substrate, a widely available material on which crystals are easily grown while assisting the object of light absorption of the absorption layer 3 is used. As a result, the semiconductor substrate is composed of a material that may have responsivity also in the near-infrared range but that inevitably has responsivity at the short-wavelength side, as compared with the absorption layer 3.

Operations and advantages corresponding to the features (1) and (2) above are (E1) and (E2), respectively.

(E1) Cross-talk, which includes incidental cross-talk that occurs through a semiconductor substrate, e.g., cross-talk due to reflected light or the like, can be suppressed. Flow of a photocurrent to a plurality of photodiodes, which may cause blurring, can be prevented, and thus blurring can also be prevented. As a result, an image with a high resolution can be obtained.

(E2) Absorption of light of a wavelength range shorter than that of near-infrared light, e.g., light of the visible range in a semiconductor substrate can be eliminated, thus improving the responsivity in both the visible light range and the near-infrared range. As a result, an image pickup device having a high responsivity in the visible light range and the near-infrared range can be obtained.

Figure 2:
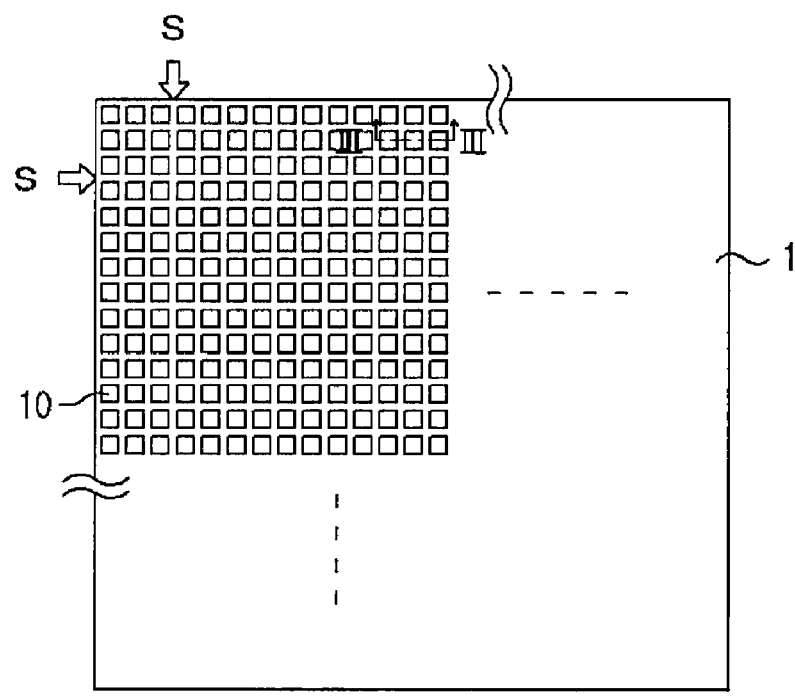
FIG. 2 is a view showing a photodiode array used in the image pickup device shown in FIG. 1.
Figure 3:
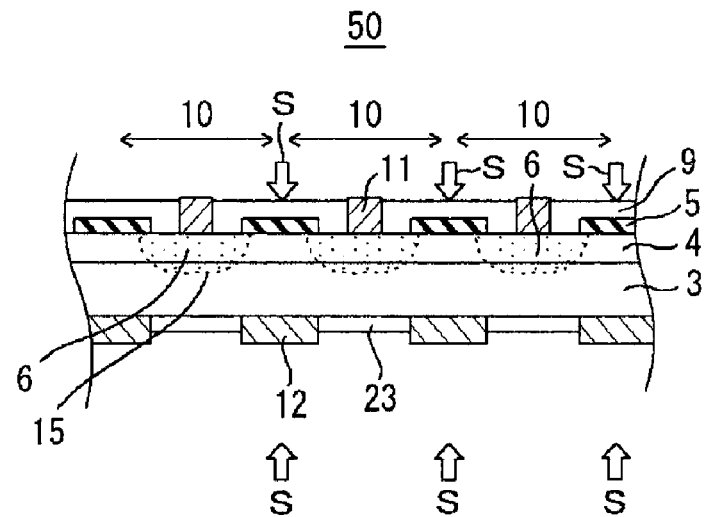
FIG. 3 is a cross-sectional view taken along line III-III of the photodiode array shown in FIG. 2.
Figure 4:
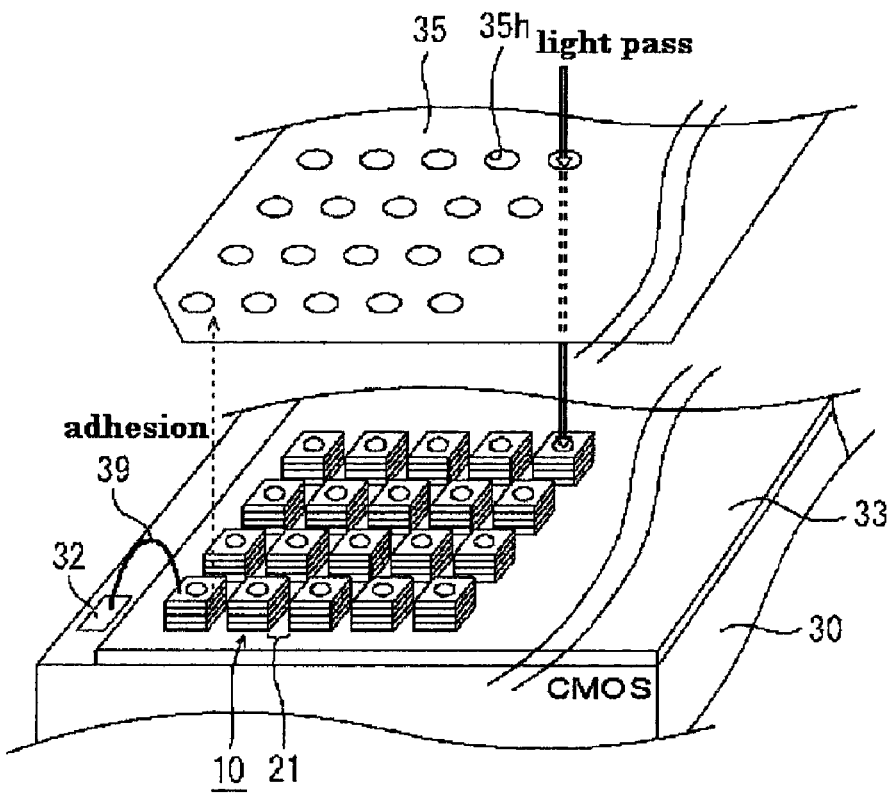
FIG. 4 is a perspective view showing a step of attaching a connecting member to the image pickup device shown in FIG. 1.

Next, steps in a manufacturing method for the image pickup device 50 shown in FIG. 1 will be described with reference to FIGS. 2 to 4.

(S1): First, a description will be made with reference to FIGS. 2 and 3. A sulfur (S)-doped n-type InP substrate 1 having a diameter of 2 inches is prepared. An n-type InP buffer layer 2, an $In_{0.53}Ga_{0.47}As$ absorption layer 3, and an InP window layer 4 are epitaxially grown on the InP substrate 1 in that order by an organo-metallic vapor-phase epitaxy (OMVPE) method to prepare an epitaxial wafer. The composition ratio of In to Ga in the InGaAs absorption layer 3 is determined so as to lattice match with the InP substrate 1. As described above, the InGaAs absorption layer 3 may contain at least one of N, P, and Sb. Whether or not the absorption layer 3 contains at least one of N, P, and Sb is determined from the standpoints of the lattice match and the long-wavelength limit of near-infrared light to be set. By incorporating N, a photodiode array having responsivity at the long-wavelength side of the near-infrared range can be obtained. By incorporating P or Sb, crystals with good quality in which the generation of dark current is suppressed can be obtained.

(S2): Silicon nitride (SiN) is deposited on the epitaxial wafer by a vapor deposition method. The resulting SiN film is processed by photolithography and etching to form a mask pattern 5 for Zn selective diffusion. Subsequently, Zn is selectively diffused in the epitaxial wafer through openings of the mask pattern 5 for Zn selective diffusion to form p-type regions 6. Each of the p-type regions 6 has a circular shape in plan view, and preferably has a diameter of 30 μm. A pixel region is formed by arraying 320 pixels in the horizontal direction and 256 pixels in the vertical direction at intervals of 50 μm (see FIG. 2). Several pixel regions each including 320 pixels arrayed in the horizontal direction and 256 pixels arrayed in the vertical direction are formed within the diameter of 2 inches. Subsequently, as an AR film 9, a SiON film having a refractive index of 1.8 and a thickness of 180 nm is formed on the entire surface of the epitaxial wafer. Openings are formed through the SiON film 9 by photolithography and etching. Specifically, part of the SiON film 9 located at predetermined positions corresponding to the p-type regions 6 of photodiodes 10 is etched so that each of the openings has a diameter of 25 μm. A p-side electrode 11 is formed in each of the openings in an ohmic contact manner.

(S3): Subsequently, the epitaxial wafer is bonded to a protective member 33 so that the p-side electrode side (i.e., epitaxial film side) is disposed at the bottom. The InP substrate 1 and the buffer layer 2, which are located on the opposite side of the protective member 33, are then removed. In order to ensure ohmic contact of an n-side electrode, a part of the n-type buffer layer 2 having the minimum thickness required for the ohmic contact may be left. The semiconductor multilayer structure including the absorption layer 3 and other components disposed at the protective member 33 side are left. Examples of a method of removing the InP substrate 1 and the buffer layer 2 include polishing, etching, and laser irradiation. As an etchant for the etching, a HCl-based solution ($HCl+H_2O$) is preferably used. Alternatively, a HBr-based solution ($HBr+H_2O_2+H_2O$) or the like may be used.

(S4): Subsequently, on the reverse face (n-region side) of the absorption layer 3 of the epitaxial wafer from which the InP substrate 1 and the buffer layer 2 have been removed, circular-shaped AR films 23 are formed by vapor deposition, photolithography, and etching. Furthermore, n-side electrodes 12 are formed at predetermined positions of the exposed absorption layer 3 so as to surround the circular-shaped AR films 23. The AR films 23 are provided on the corresponding p-type regions 6, i.e., the pixels. As described above, the p-type regions 6 each having a diameter of 30 μm are arrayed at intervals of 50 μm so that 320 p-type regions 6 are arrayed in the horizontal direction and 256 p-type regions 6 are arrayed in the vertical direction. Accordingly, the interval between the AR films 23 is also 50 μm. Each of the AR films 23 has a diameter of 40 μm so as to include the diameter of the p-type region 6. Portions where the AR films 23 are not provided are covered with the n-side electrodes 12. Thus, a photodiode wafer is prepared.

(S5): Slits 21 are formed between photodiodes constituting the photodiode array including 320 photodiodes arrayed in the horizontal direction and 256 photodiodes arrayed in the vertical direction by dicing. The photodiodes are separated from each other by this dicing. In FIGS. 2 and 3, positions where the slits 21 are to be formed are shown by S. As described above, each of the photodiodes is fixed to the protective member 33. In this state, the p-side electrode 11 of each photodiode is connected to an electrode pad 31 of a CMOS 30, with the protective member 33 therebetween. Pinholes corresponding to the 320 photodiodes arrayed in the horizontal direction and 256 photodiodes arrayed in the vertical direction have been provided in the protective member 33. The p-side electrode 11 of each photodiode is connected to the electrode pad 31 of the CMOS 30 through the pinholes, as described above.

(S6): In the above state, a space between photodiodes (pixels) is 10 μm. Subsequently, as shown in FIG. 4, a connecting member 35 for connecting the n-side electrodes 12 to each other is disposed so as to cover all the photodiodes. It is desirable that openings 35h each having a diameter of 40 μm be provided in advance so that light can enter each of the photodiodes or the pixels. The openings 35h of the connecting member 35 are provided so that 320 openings 35h are arrayed in the horizontal direction and 256 openings 35h are arrayed in the vertical direction at intervals of 50 μm, which is the same as the interval between the pixels. The openings 35h are preferably provided so that the position of each opening 35h overlaps the position of the corresponding AR film 23 (light-incident region) having a diameter of 40 μm in the photodiode 10. Preferably, all the n-side electrodes 12 of the photodiodes 10 are bonded to the connecting member 35 using an electrically conductive adhesive. Preferably, one of the n-side electrodes 12 is connected to an n-side electrode pad or a ground potential pad 32 of the CMOS 30 using a bonding wire 39. Accordingly, the n-side electrodes 12 of all the photodiodes are electrically connected to the n-side electrode pad 32 of the CMOS 30.

The image pickup device 50 shown in FIG. 1 is manufactured by the above steps. Note that modifications of each of the steps will be described below.

(N1) The separation of the photodiodes 10 (formation of the slits 21) may be performed by dicing or etching (such as wet etching or dry etching, e.g., reactive ion etching (RIE)).

(N2) The protective member 33 can be used for controlling the dicing or etching, and thus the protective member 33 is preferably provided. However, the presence of the protective member 33 is not essential.

(N3) Solder such as In, Au/Sn, or Ag/Sn can be used for connecting the p-side electrode 11 of each photodiode 10 to the electrode pad of the CMOS 30. Alternatively, the p-side electrode 11 may be connected to the electrode pad using a Ag paste. Any material may be used for the connection as long as electrical conductivity can be ensured.

(N4) The connecting member 35 for connecting the n-side electrodes 12 to each other is not limited as long as the connecting member 35 is composed of electrically conductive material. Examples of the connecting member 35 include metal foils such as aluminum (Al) foil and copper (Cu) foil, and processed electrically conductive sheets.

(N5) Any electrically conductive adhesive may be used for bonding the n-side electrodes 12 of the pixels to the connecting member 35 for connecting the n-side electrodes 12 to each other. For example, the above-mentioned solder may be used.

Modification of image pickup device shown in FIG. 1

Figure 5:
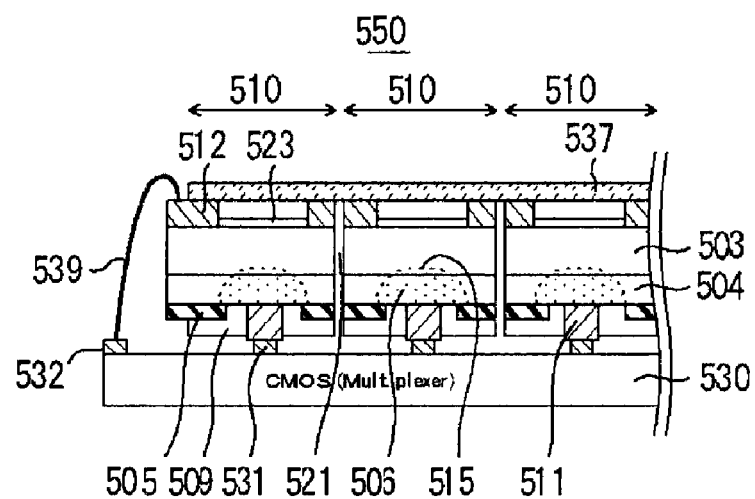
FIG. 5 is a view showing a modification of the image pickup device shown in FIG. 1.
Figure 6:
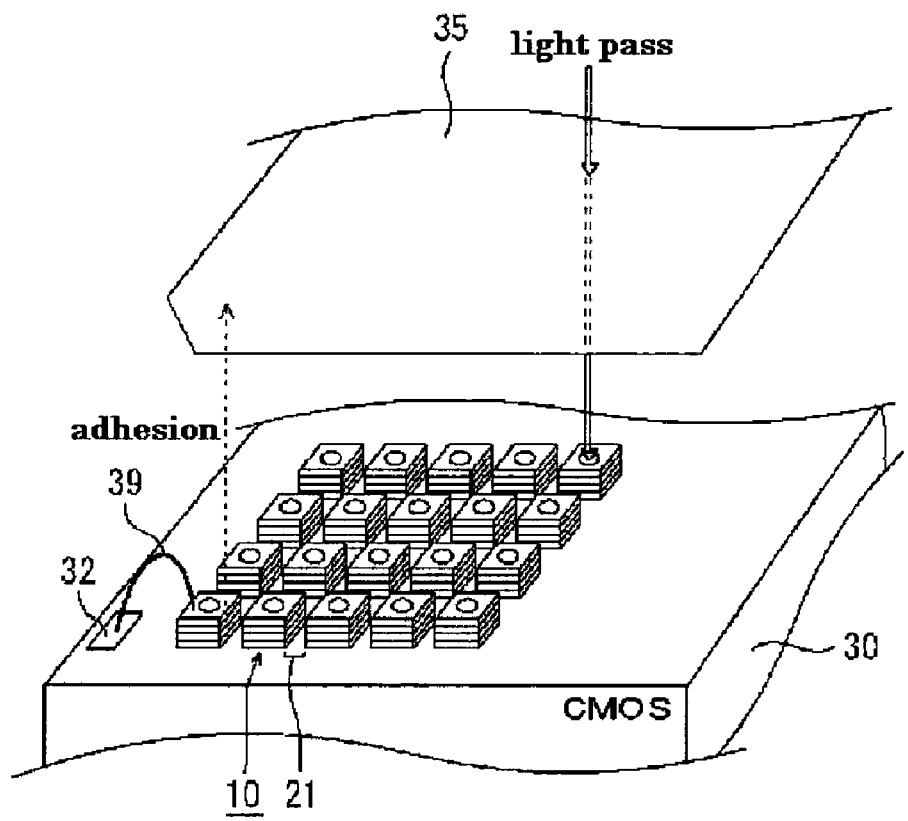
FIG. 6 is a perspective view showing a step of attaching a connecting member to the image pickup device shown in FIG. 5.

FIGS. 5 and 6 are views showing a modification of the image pickup device shown in FIG. 1. In this modification, a near-infrared light-transmissive electrically conductive sheet 537 is used as a connecting member. The connecting member 35 shown in FIG. 1 is a metal film having the openings 35h. First, a manufacturing method for the image pickup device shown in FIGS. 5 and 6 will be broadly described.

(S1): An n-type InP buffer layer, an GaInNAs absorption layer 3, and an InP window layer 4 are epitaxially grown on a S-doped n-type InP substrate in that order by a molecular beam epitaxy (MBE) method. The wavelength of the absorption layer 3 determined by a photo-luminescence (PL) measurement is 2.2 μm, and the N composition determined by secondary ion mass spectroscopy (SIMS) is 3% (atomic percent in Group V). A lattice-constant mismatch (Δa/a) between InP and GaInNAs calculated from an X-ray diffraction pattern is 0.01. The absorption edge wavelength of the GaInNAs absorption layer 3 is 2 μm.

(S2): After the InP substrate and the InP buffer are removed, a photodiode array is prepared by the same method as the first embodiment. However, an electrically conductive sheet 537 that transmits near-infrared light is used as the connecting member for connecting the n-side electrodes 512 to each other. When such an electrically conductive sheet 537 is used, openings need not be provided through the electrically conductive sheet 537. The following method may be employed, though it is different from the above-described method. Specifically, before the photodiode array is connected to a CMOS 530, arrayed photodiodes before isolation may be bonded to the electrically conductive sheet 537. The photodiodes constituting the photodiode array may then be isolated by scribing, breaking and expanding to form a predetermined space between pixels. The near-infrared light-transmissive electrically conductive sheet 537 is not particularly limited as long as the sheet 537 transmits near-infrared light and has electrical conductivity. For example, a polyethylene terephthalate (PET) sheet film on which a Ca-added ZnO film is deposited may be used.

The operation and advantage obtained by using the near-infrared light-transmissive electrically conductive sheet 537 are as follows. Since the near-infrared light-transmissive electrically conductive sheet 537 transmits near-infrared light, which is a target of absorption, openings need not be provided through the electrically conductive sheet 537. However, a characteristic of the image pickup device varies depending on the absorption characteristic of the electrically conductive sheet 537 in a wavelength range shorter than the near-infrared range. For example, when absorption in the visible light range is negligible, an image pickup device for visible light and near-infrared light having high responsivity can be obtained. When absorption in the visible light range is very large, the target of light absorption may be focused on the near-infrared range, and the responsivity of an electronic system of the CMOS 530 may also be set in such a manner that the near-infrared range is focused on. Thus, a near-infrared dedicated image pickup device that is easy to use can be obtained. The absorption characteristic of the near-infrared light-transmissive electrically conductive sheet 537 at the short-wavelength side can be determined in accordance with the application of the image pickup device.

In addition, in the image pickup device 550 shown in FIG. 5, the photodiode array is connected to the CMOS 530 without using a protective member. As described in (N2) above, the protective member may not be used. In this case, the following method is preferably employed to form slits between photodiodes. Specifically, before the photodiode array is connected to the CMOS 530, arrayed photodiodes before isolation are bonded to the electrically conductive sheet 537. The photodiodes constituting the photodiode array are then isolated by scribing, breaking and expanding to form a predetermined space between pixels. In this manner, the slits can be easily formed between photodiodes without using a protective member. Furthermore, p-side electrodes 511 and corresponding electrode pads 531 of the CMOS 530 are strongly connected to each other. Accordingly, even when slits 521 are provided, that is, even when the photodiodes 510 are separated from each other, the positions of photodiodes 510 can be stably maintained.

Figure 7:
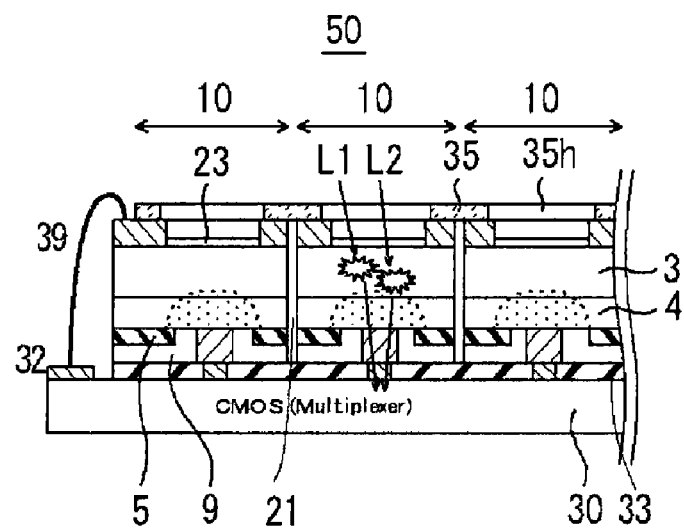
FIG. 7 is a view illustrating operations and advantages of the image pickup device according to the first embodiment of the present invention.

FIG. 7 is a view illustrating operations and advantages of the image pickup device 50 (the image pickup device 50 shown in FIG. 1 and the image pickup device 550 shown in FIG. 5) according to this embodiment.

(1) In the image pickup device 50 of this embodiment, light L1 and light L2 incident from a light-incident surface are absorbed in the absorption layer 3. Since a photocurrent generated here is surrounded by the slits 21, the photocurrent is not received by an adjacent photodiode. Accordingly, blurring of an image does not occur. In addition, because of the structure surrounded by the slits 21 extending over the entire thickness of the semiconductor multilayer structure, leakage of the light L1 and light L2 to an adjacent photodiode does not occur. In particular, since a semiconductor substrate is not included, leakage of light passing through the semiconductor substrate can be prevented, thus preventing cross-talk. As a result, a good-quality image having a high resolution can be obtained.

(2) A semiconductor substrate is not included, and thus an absorption by the semiconductor substrate at the short-wavelength side of the near-infrared range does not occur. Accordingly, an optimum image pickup device which is not affected by the absorption characteristic of the semiconductor substrate can be obtained in accordance with target light. For example, by eliminating the absorption of the visible light and providing an absorption layer 3 having a cut-off wavelength in the near-infrared range, an image pickup device having high responsivity in the visible light range and the near-infrared range can be obtained. Furthermore, by significantly increasing the absorption of the entire visible range by the near-infrared light-transmissive electrically conductive sheet, a near-infrared dedicated image pickup device that is easy to use can be obtained.

Second Embodiment

Figure 8:
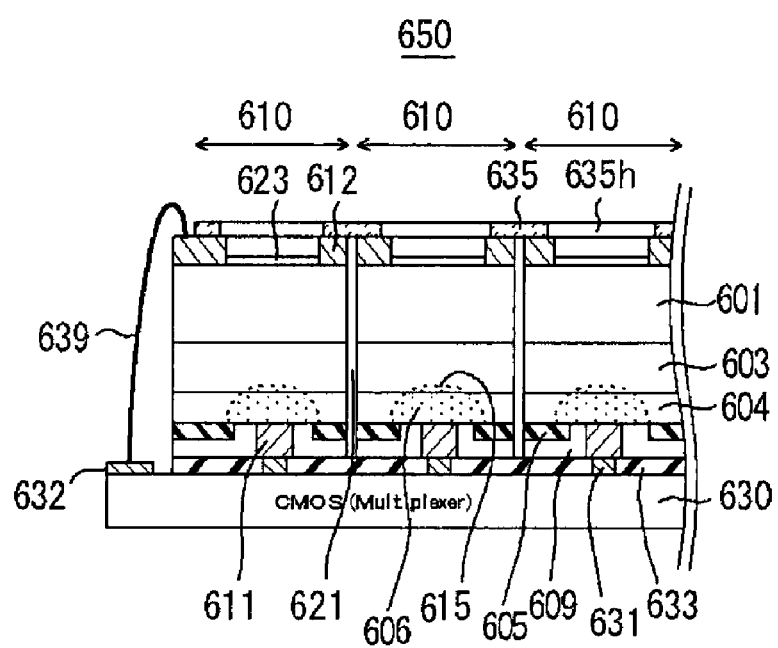
FIG. 8 is a view showing an image pickup device according to a second embodiment of the present invention.

FIG. 8 is a view showing an image pickup device according to a second embodiment of the present invention. The image pickup device of this embodiment differs from the image pickup device of the first embodiment in that an InP substrate 601 is used. Accordingly, a decrease in the yield due to the removal of the InP substrate can be prevented. In particular, when slits 621 are formed, this structure can prevent a decrease in the mass-production yield caused by an unstable factor resulting from insufficient rigidity due to the absence of the InP substrate. As a result, the manufacturing cost can be reduced. A manufacturing method for the image pickup device of this embodiment is the same as the first embodiment except that the method does not include the step of removing the InP substrate and includes small changes related to the elimination of the step. Therefore, a description of the method is omitted.

In general, an InP buffer layer is provided between an InP substrate and an absorption layer. However, in FIG. 8, it is assumed that the InP buffer layer is included in the InP substrate, and thus the InP buffer layer is not shown. Slits 621 are provided over the entire thickness of the semiconductor multilayer structure including an InP substrate 601. Therefore, although the InP substrate 601 remains, cross-talk caused when light passes through the InP substrate 601 and is absorbed again in an adjacent photodiode can be suppressed by the presence of the slit 621. Even if visible light is absorbed in the InP substrate 601, absorption of a photocurrent by an adjacent photodiode can be prevented by the presence of the slits 621. Therefore, blurring can be completely prevented. As a result, a high-resolution image can be obtained.

As for the InP substrate 601, the following points should be noted. Since the InP substrate 601 has an absorption characteristic at the short-wavelength side of the near-infrared range, in particular, in the visible light range, the image pickup device including the InP substrate 601 should be a near-infrared dedicated image pickup device. It should be understood that this does not degrade the value of an image pickup device 650 shown in FIG. 8, and the near-infrared dedicated image pickup device 650 including a visible light-absorbing filter can be obtained by a simple manufacturing process.

Modification of the Image Pickup Device Shown in FIG. 8

Figure 9:
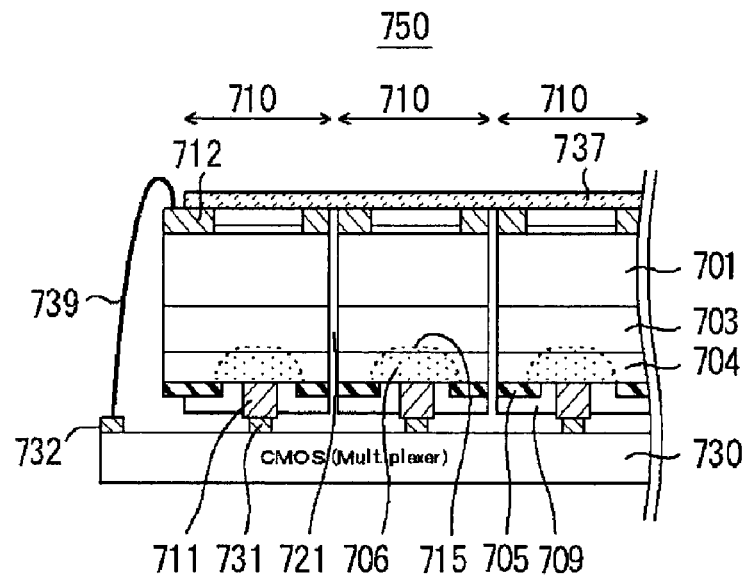
FIG. 9 is a view showing a modification of the image pickup device shown in FIG. 8.

FIG. 9 is a view showing a modification of the image pickup device shown in FIG. 8. This modification differs from the image pickup device shown in FIG. 8 in the following points, but other structures are the same as those of the image pickup device shown in FIG. 8.

(1) A near-infrared light-transmissive electrically conductive sheet 737 is used as a connecting member. A connecting member 635 shown in FIG. 8 is a metal film having openings 635h. Unlike the image pickup device 550 shown in FIG. 5 or 6, because of the placement of an InP substrate 701, whether the near-infrared light-transmissive electrically conductive sheet is used or not should be determined exclusively from the standpoint of economical efficiency or the like.

(2) A photodiode array is connected to a CMOS 730 without using a protective member. As described in (N2) above, a protective member may not be used. P-side electrodes 711 and corresponding electrode pads 731 of the CMOS 730 are strongly connected to each other. Accordingly, even when slits 721 are provided, that is, even when photodiodes 710 are separated from each other, the positions of the photodiodes 710 can be stably maintained.

Figure 10:
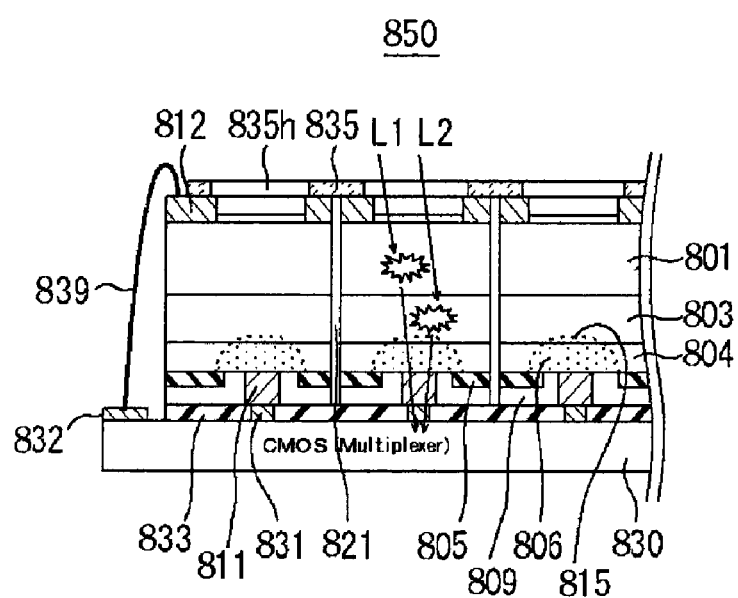
FIG. 10 is a view illustrating operations and advantages of the image pickup device according to the second embodiment of the present invention.

FIG. 10 is a view illustrating operations and advantages of an image pickup device 850 according to this embodiment.

(1) In the image pickup device 850 of this embodiment, light L1 and light L2 incident from a light-incident surface are absorbed in an InP substrate 801 and an absorption layer 803. However, since a photocurrent generated here is surrounded by slits 821 extending over the entire thickness of a semiconductor multilayer structure including the InP substrate 801, the photocurrent is not received by an adjacent photodiode. Accordingly, blurring of an image does not occur. In addition, because of the structure surrounded by the slits 821 extending over the entire thickness of the semiconductor multilayer structure, leakage of light to an adjacent photodiode is suppressed and leakage of light passing through the semiconductor substrate can be suppressed. Accordingly, cross-talk can be suppressed. As a result, a good-quality image having a high resolution can be obtained.

(2) As described above, a decrease in the yield due to the removal of the InP substrate can be prevented. In particular, when the slits 821 are formed, this structure can prevent a decrease in the mass-production yield caused by an unstable factor resulting from insufficient rigidity due to the absence of the InP substrate. As a result, the manufacturing cost can be reduced.

Third Embodiment

Figure 11:
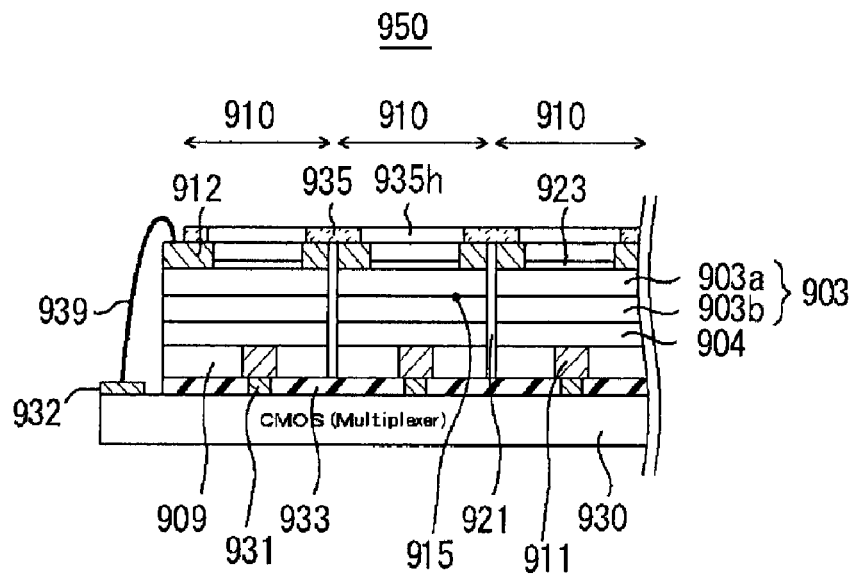
FIG. 11 is a view showing an image pickup device according to a third embodiment of the present invention.
Figure 12:
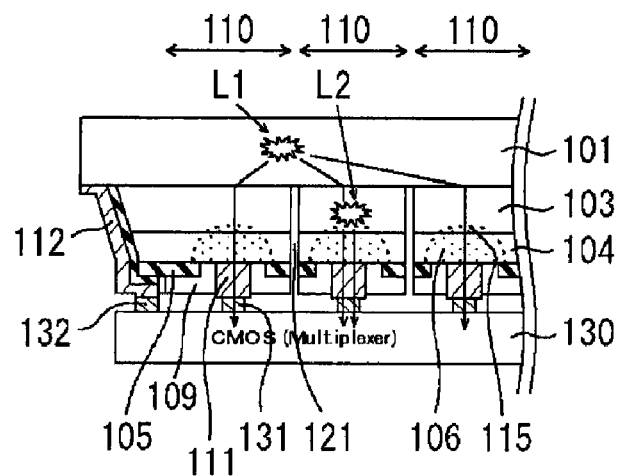
FIG. 12 is a view showing an image pickup device in the related art.

FIG. 11 is a view showing an image pickup device according to a third embodiment of the present invention. The image pickup device of this embodiment differs from the image pickup device 50 of the first embodiment in that a p-n junction 915 provided in an absorption layer 903 is formed not by selective diffusion of a p-type impurity but by epitaxially growing a p-type layer 903a (903b) and an n-type layer 903b (903a). As for the positional relationship in the vertical direction of the p-type layer and the n-type layer, either layer may be adjacent to a CMOS 930. Since selective diffusion of a p-type impurity need not be performed, not only a step of the selective diffusion but also a step of forming a selective diffusion mask pattern can be eliminated. Consequently, the manufacturing cost can be reduced.

A manufacturing method for the image pickup device of this embodiment is as follows. Specifically, in the method of the first embodiment, the step of forming the absorption layer 3 by epitaxial growth is divided into two steps. In one of the two steps, an n-type impurity (or a p-type impurity) is introduced in the absorption layer 903a or an impurity is hardly introduced, or a p-type impurity (or an n-type impurity) is introduced in the other absorption layer 903b. Furthermore, as described above, the step of forming the selective diffusion mask pattern 5, and the step of selective diffusion are omitted. In the structure shown in FIG. 11, n-side electrodes 912 are connected to a ground potential in common, and thus an n-type impurity is introduced in the absorption layer 903a. The manufacturing method for the image pickup device of this embodiment is the same as the manufacturing method for the image pickup device shown in FIG. 1 except that the method of this embodiment includes changes related to the elimination of the selective diffusion for forming the p-n junction 915.

An image pickup device 950 of this embodiment has the following operations and advantages.

(1) The effect of preventing cross-talk and the effect of preventing blurring that are similar to those achieved in the image pickup devices (the image pickup device 50 shown in FIG. 1 and the image pickup device 550 shown in FIG. 5, which is a modification of the image pickup device 50) of the first embodiment can be obtained.

(2) Compared with the image pickup devices of the first and second embodiments, selective diffusion of a p-type impurity need not be performed in manufacturing the image pickup device of this embodiment. Accordingly, not only a step of the selective diffusion but also a step of forming a selective diffusion mask pattern can be eliminated. Consequently, the manufacturing cost can be reduced.

(3) By modifying the image pickup device shown in FIG. 11, p-side electrodes may be used as the common electrodes, and n-side electrodes may be used as electrodes connected to electrode pads 931 of the CMOS 930. In this case, a general-purpose type circuit configuration can be used in the CMOS 930. As a result, the manufacturing cost of the CMOS 930 to be installed in an image pickup device for near-infrared light can be reduced, and finally, economical efficiency of the image pickup device can be improved.

In the image pickup device 950 of this embodiment, a semiconductor substrate may be removed as shown in FIG. 11. Alternatively, the image pickup device 950 may include a semiconductor substrate. This is because cross talk and blurring can be suppressed to obtain an image having a high resolution as long as slits 921 are provided so as to extend over the entire thickness of a semiconductor multilayer structure including the semiconductor substrate. Each photodiode in this embodiment has a mesa structure, and a p-n junction is exposed to an end face of the mesa structure.

Embodiments Other than the First Embodiment to the Third Embodiment (1) In the broadest sense of a photodiode array and an image pickup device of the present invention, near-infrared light may not be a main target of light absorption, and light of other wavelength ranges may be a target of light absorption.

(2) The first to third embodiments describe only image pickup devices including hollow slits. Alternatively, the slits may be filled with an insulating material.

(3) In the third embodiment, an image pickup device having a semiconductor multilayer structure from which a semiconductor substrate is removed has been described with reference to the drawing. Alternatively, the image pickup device may have a semiconductor multilayer structure including a semiconductor substrate.

Embodiments of the present invention have been described above. However, the embodiments the present invention disclosed above are only illustrative, and the scope of the present invention is not limited to the specific embodiments of the invention. It is to be understood that the scope of the present invention is defined in the appended claims and includes equivalence of the description of the claims and all changes within the scope of the claims.

What is claimed is:

1. A photodiode array comprising:
a substrate of a common read-out control circuit; and
a plurality of photodiodes arrayed on the substrate and each including an absorption layer, and a pair of a first conductive-side electrode and a second conductive-side electrode,
wherein each of the photodiodes is separated from adjacent photodiodes,
the first conductive-side electrodes are provided on first conductivity-type regions and electrically connected in common across all the photodiodes,
the second conductive-side electrodes are provided on second conductivity-type regions and individually electrically connected to read-out electrodes of the read-out control circuit,
the photodiodes are semiconductor multilayer structures formed on a semiconductor substrate,
the semiconductor substrate has been removed or the semiconductor substrate is included in the semiconductor multilayer structure,
each of the second conductivity-type regions is formed by selective diffusion for corresponding photodiode so as to face the absorption layer,
the second conductive-side electrodes are provided on the corresponding second conductivity-type regions,
the second conductive-side electrodes are connected to the corresponding read-out electrodes on the substrate of the read-out control circuit, and
a surface of the semiconductor multilayer structures opposite a surface on which the second conductive-side electrodes are disposed functions as a light-incident surface.

* * * * *